(12) United States Patent
Marshall

(10) Patent No.: US 11,686,755 B2
(45) Date of Patent: Jun. 27, 2023

(54) RAPID EVALUATION OF INEQUALITY EXPRESSIONS FOR ELECTROMAGNETIC PROPAGATION

(71) Applicant: Google LLC, Mountain View, CA (US)

(72) Inventor: Preston Fairfax Marshall, Woodbridge, VA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/649,677

(22) Filed: Feb. 1, 2022

(65) Prior Publication Data

US 2022/0244300 A1 Aug. 4, 2022

Related U.S. Application Data

(60) Provisional application No. 63/145,061, filed on Feb. 3, 2021.

(51) Int. Cl.
*G01R 29/08* (2006.01)
(52) U.S. Cl.
CPC .................. *G01R 29/0814* (2013.01)
(58) Field of Classification Search
CPC .................. G01R 29/0814; H04W 16/18
USPC ........................................... 324/144
See application file for complete search history.

(56) References Cited

U.S. PATENT DOCUMENTS

| | | | |
|---|---|---|---|
| 6,625,135 B1 | 9/2003 | Johnson et al. | |
| 6,947,708 B2 | 9/2005 | Fattouch | |
| 8,040,816 B2 * | 10/2011 | Wakizaka | H04B 1/713 370/335 |
| 9,271,243 B2 * | 2/2016 | Yoon | H04B 17/318 |
| 9,923,789 B2 * | 3/2018 | Lee | H04W 52/343 |
| 10,117,064 B1 | 10/2018 | De Lorenzo et al. | |
| 10,306,487 B1 * | 5/2019 | Linkola | H04W 72/56 |

(Continued)

OTHER PUBLICATIONS

Pusnik Tihomir et al: "Calibration of propagation model for LTE urban clutter in practice", 2015 25th International Conference Radioelektronika (Radioelektronika), IEEE, Apr. 21, 2015 (Apr. 21, 2015), pp. 284-287, XP032786946, DOI: 10.1109/RADIOELEK. 2015.7129069.

(Continued)

*Primary Examiner* — Christopher P McAndrew
(74) *Attorney, Agent, or Firm* — Honigman LLP; Brett A. Krueger

(57) ABSTRACT

A method for rapidly evaluating inequality expressions for electromagnetic propagation includes obtaining a threshold loss value establishing a maximum electromagnetic (EM) path loss between a first geographical point and a second geographical point. The method also includes, for each of a plurality of EM paths between the first geographical point and the second geographical point, obtaining a minimum EM loss value for the corresponding EM path and a maximum EM loss value for the corresponding EM path and determining whether the maximum EM loss value for the corresponding EM path satisfies the threshold loss value. Additionally, the method includes, when the maximum EM loss value for the corresponding EM path satisfies the threshold loss value, determining that an actual EM path loss value for the corresponding EM path between the first geographical point and the second geographical point satisfies the threshold loss value.

26 Claims, 9 Drawing Sheets

(56) References Cited

U.S. PATENT DOCUMENTS

2003/0073442 A1\* 4/2003 Fattouch ............... H04W 16/18
　　　　　　　　　　　　　　　　　　　　　　455/446
2007/0049319 A1\* 3/2007 Hart ...................... H04W 16/18
　　　　　　　　　　　　　　　　　　　　　　455/522

OTHER PUBLICATIONS

May 17, 2022 Written Opinion (WO) of the International Searching Authority (ISA) and International Search Report (ISR) issued in International Application No. PCT/US2022/014805.

\* cited by examiner

RAPID EVALUATION OF INEQUALITY EXPRESSIONS FOR ELECTROMAGNETIC PROPAGATION

CROSS REFERENCE TO RELATED APPLICATIONS

This U.S. patent application claims priority under 35 U.S.C. § 119(e) to U.S. Provisional Application 63/145,061, filed on Feb. 3, 2021. The disclosure of this prior application is considered part of the disclosure of this application and is hereby incorporated by reference in its entirety.

TECHNICAL FIELD

This disclosure relates to rapid evaluation of inequality expressions for electromagnetic propagation.

SUMMARY

One aspect of the disclosure provides a method for rapidly evaluating inequality expressions for electromagnetic propagation. The method includes obtaining a threshold loss value establishing a maximum electromagnetic (EM) path loss between a first geographical point and a second geographical point. For each of a plurality of EM paths between the first geographical point and the second geographical point. The method also includes obtaining a minimum EM loss value for the corresponding EM path and a maximum EM loss value for the corresponding EM path and determining whether the maximum EM loss value for the corresponding EM path satisfies the threshold loss value. Additionally, when the maximum EM loss value for the corresponding EM path satisfies the threshold loss value, the method includes determining that an actual EM path loss value for the corresponding EM path between the first geographical point and the second geographical point satisfies the threshold loss value. The maximum EM loss value for the corresponding EM path satisfies the threshold loss value when the maximum EM loss value is less than the threshold loss value. In addition, the maximum EM loss value for the corresponding EM path fails to satisfy the threshold loss value when the maximum EM loss value is greater than or equal than the threshold loss value.

Implementations of the disclosure may include one or more of the following optional features. In some implementations, when the maximum EM loss value obtained for each corresponding EM path of the plurality of EM paths between the first geographical point and the second geographical point fails to satisfy the threshold loss value, the method further includes determining whether the minimum EM loss value obtained for each corresponding EM path of the plurality of EM paths between the first geographical point and the second geographical point fails to satisfy the threshold loss value. In some implementations, when the minimum EM loss value obtained for each corresponding EM path fails to satisfy the threshold loss value, the method includes determining that each of the plurality of EM paths between the first geographical point and the second geographical point includes a corresponding actual EM path loss value that fails to satisfy the threshold loss value.

In some examples, when the minimum EM loss value obtained for each of one or more corresponding EM paths of the plurality of EM paths between the first geographical point and the second geographical point satisfies the threshold loss value, the method includes obtaining a refining cost associated with the corresponding EM loss path for each of the one or more corresponding EM paths including the minimum EM loss value that satisfied the threshold loss value. The refining cost may be representative of an amount of resources required to refine the minimum EM loss value and the maximum EM loss value of the corresponding EM path. In some examples, the method also includes selecting one of the one or more corresponding EM paths based on the obtained refining costs. In some examples, the method also includes refining the minimum EM loss value obtained for the selected one of the one or more corresponding EM paths and the maximum EM loss value obtained for the selected one of the one or more corresponding EM paths. In some examples, the method also includes determining whether the refined maximum EM loss value satisfies the threshold loss value. In some examples, when the refined maximum EM loss value satisfies the threshold loss value, the method also includes determining that the actual EM path loss for the selected one of the one or more corresponding EM paths between the first geographical point and the second geographical point satisfies the threshold loss value.

In some implementations, when the refined minimum EM loss value fails to satisfy the threshold loss value, the method further includes selecting a different one of the one or more corresponding EM paths based on the obtained refining costs. In some examples, selecting one of the one or more corresponding EM paths includes selecting the one of the one or more corresponding EM paths associated with the lowest refining cost. In some examples, for each of the plurality of EM paths, the corresponding minimum EM loss value and the corresponding maximum EM loss value are associated with an initial cost representative of an amount of resources required to obtain the minimum EM loss value and the maximum EM loss value. For each of the plurality of EM paths, the initial cost may be less than the refining cost.

Each of the plurality of EM paths may include one or more loss components. In some implementations, the minimum EM loss value includes a sum of a minimum of each of the one or more loss components of the corresponding EM path for each of the plurality of EM paths, and the maximum EM loss value includes a sum of a maximum of each of the one or more loss components of the corresponding EM path for each of the plurality of EM paths.

For one or more of the plurality of EM paths, the minimum EM loss value for the corresponding EM path and the maximum EM loss value for the corresponding EM path may include data associated with a previously determined actual EM path loss value.

In some implementations, obtaining the threshold loss value includes receiving a request including the threshold loss value. The request may request determination of whether an actual EM path loss between the first geographical point and the second geographical point exceeds the threshold loss value. In some implementations, obtaining the threshold loss value includes receiving a request including the threshold loss value. The request may request determination of whether an actual EM path loss between the first geographical point and the second geographical point is less than the threshold loss value.

In some implementations, in response to determining whether the actual EM path loss value for the corresponding EM path between the first geographical point and the second geographical point satisfies the threshold loss value, the method further includes planning wireless network coverage. In some implementations, in response to determining whether the actual EM path loss value for the corresponding EM path between the first geographical point and the second geographical point satisfies the threshold loss value, the method further includes performing dynamic deconfliction of wireless spectrum usage.

Another aspect of the disclosure provides a system for rapidly evaluating inequality expressions for electromagnetic propagation. The system includes data processing hardware and memory hardware in communication with the data processing hardware. The memory hardware stores instructions that when executed on the data processing hardware cause the data processing hardware to perform operations. The operations include obtaining a threshold loss value establishing a maximum electromagnetic (EM) path loss between a first geographical point and a second geographical point. For each of a plurality of EM paths between the first geographical point and the second geographical point, the operations also include obtaining a minimum EM loss value for the corresponding EM path and a maximum EM loss value for the corresponding EM path and determining whether the maximum EM loss value for the corresponding EM path satisfies the threshold loss value. Additionally, when the maximum EM loss value for the corresponding EM path satisfies the threshold loss value, the operations include determining that an actual EM path loss value for the corresponding EM path between the first geographical point and the second geographical point satisfies the threshold loss value. The maximum EM loss value for the corresponding EM path may satisfy the threshold loss value when the maximum EM loss value is less than the threshold loss value. In addition, the maximum EM loss value for the corresponding EM path may fail to satisfy the threshold loss value when the maximum EM loss value is greater than or equal than the threshold loss value.

Implementations of the disclosure may include one or more of the following optional features. In some implementations, when the maximum EM loss value obtained for each corresponding EM path of the plurality of EM paths between the first geographical point and the second geographical point fails to satisfy the threshold loss value, the operations further include determining whether the minimum EM loss value obtained for each corresponding EM path of the plurality of EM paths between the first geographical point and the second geographical point fails to satisfy the threshold loss value. In some implementations, when the minimum EM loss value obtained for each corresponding EM path fails to satisfy the threshold loss value, the operations include determining that each of the plurality of EM paths between the first geographical point and the second geographical point includes a corresponding actual EM path loss value that fails to satisfy the threshold loss value.

In some examples, when the minimum EM loss value obtained for each of one or more corresponding EM paths of the plurality of EM paths between the first geographical point and the second geographical point satisfies the threshold loss value, the operations include obtaining a refining cost associated with the corresponding EM loss path for each of the one or more corresponding EM paths including the minimum EM loss value that satisfied the threshold loss value. The refining cost may be representative of an amount of resources required to refine the minimum EM loss value and the maximum EM loss value of the corresponding EM path. In some examples, the operations also include selecting one of the one or more corresponding EM paths based on the obtained refining costs. In some examples, the operations also include refining the minimum EM loss value obtained for the selected one of the one or more corresponding EM paths and the maximum EM loss value obtained for the selected one of the one or more corresponding EM paths.

In some examples, the operations also include determining whether the refined maximum EM loss value satisfies the threshold loss value. In some examples, when the refined maximum EM loss value satisfies the threshold loss value, the operations also include determining that the actual EM path loss for the selected one of the one or more corresponding EM paths between the first geographical point and the second geographical point satisfies the threshold loss value.

In some implementations, when the refined minimum EM loss value fails to satisfy the threshold loss value, the operations further include selecting a different one of the one or more corresponding EM paths based on the obtained refining costs. In some examples, selecting one of the one or more corresponding EM paths includes selecting the one of the one or more corresponding EM paths associated with the lowest refining cost. In some examples, for each of the plurality of EM paths, the corresponding minimum EM loss value and the corresponding maximum EM loss value are associated with an initial cost representative of an amount of resources required to obtain the minimum EM loss value and the maximum EM loss value. For each of the plurality of EM paths, the initial cost may be less than the refining cost.

Each of the plurality of EM paths may include one or more loss components. In some implementations, the minimum EM loss value includes a sum of a minimum of each of the one or more loss components of the corresponding EM path for each of the plurality of EM paths, and the maximum EM loss value includes a sum of a maximum of each of the one or more loss components of the corresponding EM path for each of the plurality of EM paths.

For one or more of the plurality of EM paths, the minimum EM loss value for the corresponding EM path and the maximum EM loss value for the corresponding EM path may include data associated with a previously determined actual EM path loss value.

In some implementations, obtaining the threshold loss value includes receiving a request including the threshold loss value. The request may request determination of whether an actual EM path loss between the first geographical point and the second geographical point exceeds the threshold loss value. In some implementations, obtaining the threshold loss value includes receiving a request including the threshold loss value. The request may request determination of whether an actual EM path loss between the first geographical point and the second geographical point is less than the threshold loss value.

In some implementations, in response to determining whether the actual EM path loss value for the corresponding EM path between the first geographical point and the second geographical point satisfies the threshold loss value, the operations further include planning wireless network coverage. In some implementations, in response to determining whether the actual EM path loss value for the corresponding EM path between the first geographical point and the second geographical point satisfies the threshold loss value, the operations further include performing dynamic deconfliction of wireless spectrum usage.

BACKGROUND

Use of propagation analysis is an increasingly important part of wireless practice. Not only is the analysis used to initially plan network coverage, but it is frequently also used to perform dynamic de-confliction of spectrum usage, such as for the recently established Citizens Broadband Radio Service (CBRS) band and 6 GHz unlicensed regulations. The traditional approach includes running a detailed analysis of propagation to determine whether certain conditions are met. For example, the analysis determines whether too much or too little electromagnetic (EM) path loss is present between two different geographical points.

DESCRIPTION OF DRAWINGS

Like reference symbols in the various drawings indicate like elements.

DETAILED DESCRIPTION

The use of propagation analysis is regularly used for tasks such as initially planning network coverage and performing dynamic de-confliction of spectrum usage (e.g., for Citizens Broadband Radio Service (CBRS)) band (i.e., 3550 MHz to 3700 MHz) and 6 GHz unlicensed regulations). The conventional approach for propagation analysis includes determining, via a detailed analysis, whether certain conditions are met. For example, the analysis determines whether too much or too little electromagnetic (EM) path loss is present between two different geographical points. These computations are often complex and may involve enormous amounts of data (e.g., geo-spatial data or measurement data) to process.

In many cases, the resolution required to satisfactorily complete the propagation analysis is not the exact value of the loss, but instead whether the signal qualifies for further, and presumably more detailed analysis. In these cases, determining that a path loss is less than a threshold value may be sufficient to make a decision. Additionally or alternatively, determining that a path loss is greater than a threshold value may be sufficient to make a different decision. Thus, in these cases, there is no need for high resolution analysis (i.e., determining the exact value of the loss). As a specific example, a communications link is viable for any path loss less than 130 decibels (dB). In this example, whether the actual path loss was 110 dB or 120 dB is immaterial, as in either scenario the actual path loss is less than 130 dB. Similarly, whether the actual path loss is 160 dB or 180 dB is also immaterial, as in either scenario the actual path loss is greater than 130 dB. In yet another example, a particular signal does cause interference so long as there is at least 150 dB of isolation. In this example, precise calculations are again unnecessary, as instead it is only necessary to determine whether there is less than or greater than 150 dB of isolation.

Implementations herein provide a low resource consumption model that determines whether propagation loss is more than or less than a threshold value. That is, the model determines whether the propagation loss is greater than the threshold value, less than the threshold value, or indeterminate. When the model determines that the propagation loss is indeterminate, the model may further invest into the analysis to further refine (i.e., make more precise) to determine a more definite answer. That is, the system may fall back and perform a high resolution analysis for a portion of the propagation loss. Because conventional techniques default to a full high resolution analysis, implementations herein offer significant reduction in resources.

Figure 1:
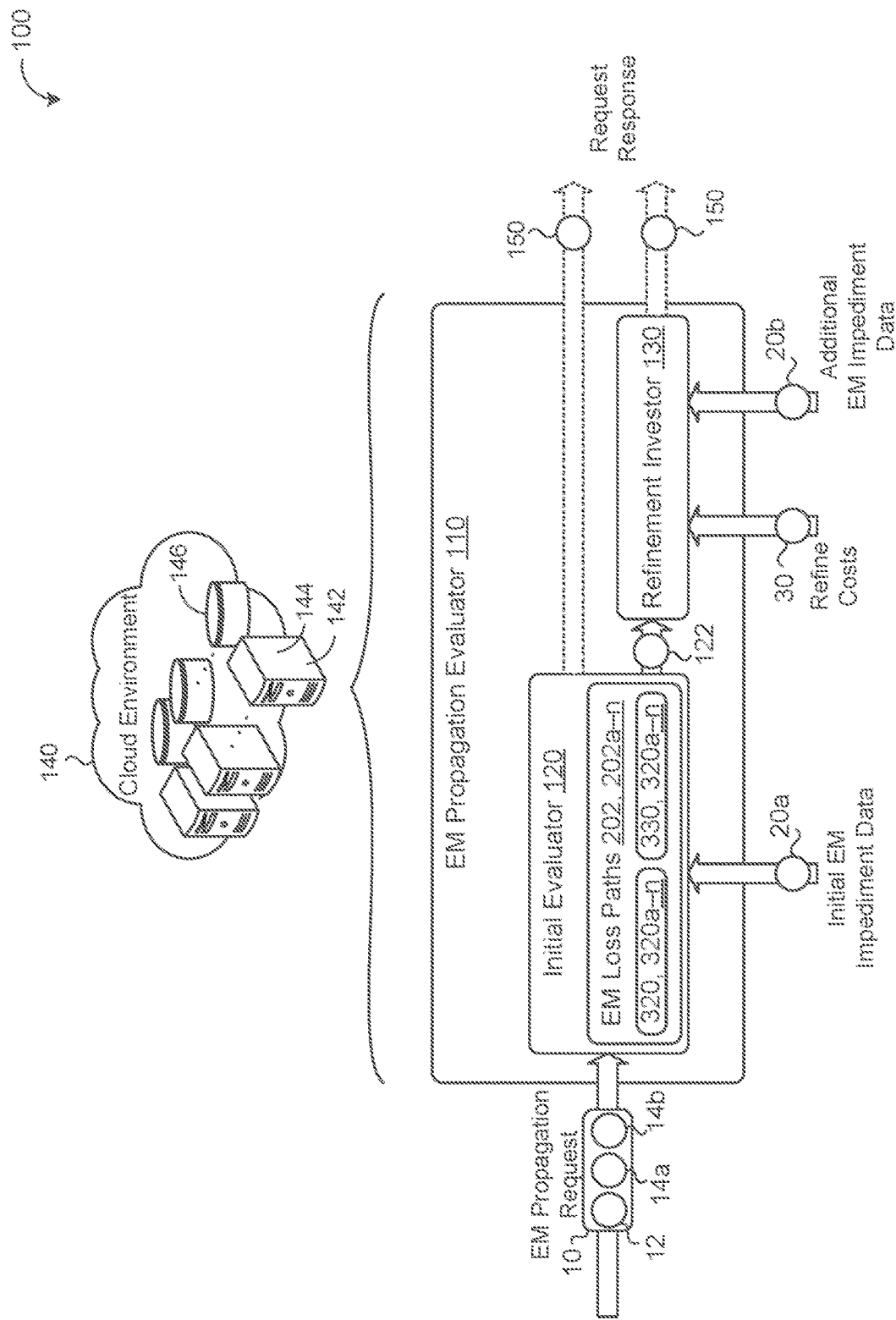
FIG. 1 is a schematic view of a system for rapidly evaluating inequality expressions for electromagnetic propagation.

Referring to FIG. 1, in some implementations, an example system 100 includes a processing system 140. The processing system 140 may be a single computer, multiple computers, or a distributed system (e.g., a cloud environment) having scalable/elastic computing resources 144 (e.g., data processing hardware) and/or storage resources 142 (e.g., memory hardware). A data store 146 (i.e., a remote storage device 146) may be overlain on the storage resources 142 to allow scalable use of the storage resources 142. The processing system 140 executes an electromagnetic (EM) propagation evaluator 110.

The EM propagation evaluator 110 obtains a threshold loss value 12 that establishes a maximum EM path loss between a first geographical point 14a and a second geographical point 14b. The EM propagation evaluator 110 may receive an EM propagation request 10. In some examples, the EM propagation evaluator 110 receives the EM propagation request 10 from another system or application executing on the processing system 140 or from a third party. The EM propagation request 10 may request that the EM propagation evaluator 110 determine whether the actual EM loss between the first geographical point 14a and the second geographical point 14b satisfies the threshold loss value 12. In some examples, the EM propagation request 10 requests that the EM propagation evaluator 110 determine whether the actual EM loss between the first geographical point 14a and the second geographical point 14b is less than the threshold loss value 12, less than or equal to the threshold loss value 12, greater than the threshold loss value 12, or greater than or equal to the threshold loss value 12. Put another way, instead of a request for a specific EM loss value between two geographical points 14, the request 10 simply requests a determination of whether the EM loss value between the two geographical points 14 satisfies or fails to satisfy the threshold loss value. The EM propagation is a falsifiable expression which the EM propagation evaluator 110 can typically solve much faster than a conventional request that requests for the actual EM loss between two geographical points.

In some implementations, the EM propagation evaluator 110 includes an initial evaluator 120 that obtains the threshold loss value 12, the first geographical point 14a, and the second geographical point 14b. The initial evaluator 120 also obtains a plurality of EM loss paths 202, 202a-n. In some examples, the EM loss paths 202 are based on initial EM impediment data 20a.

Figure 2A:
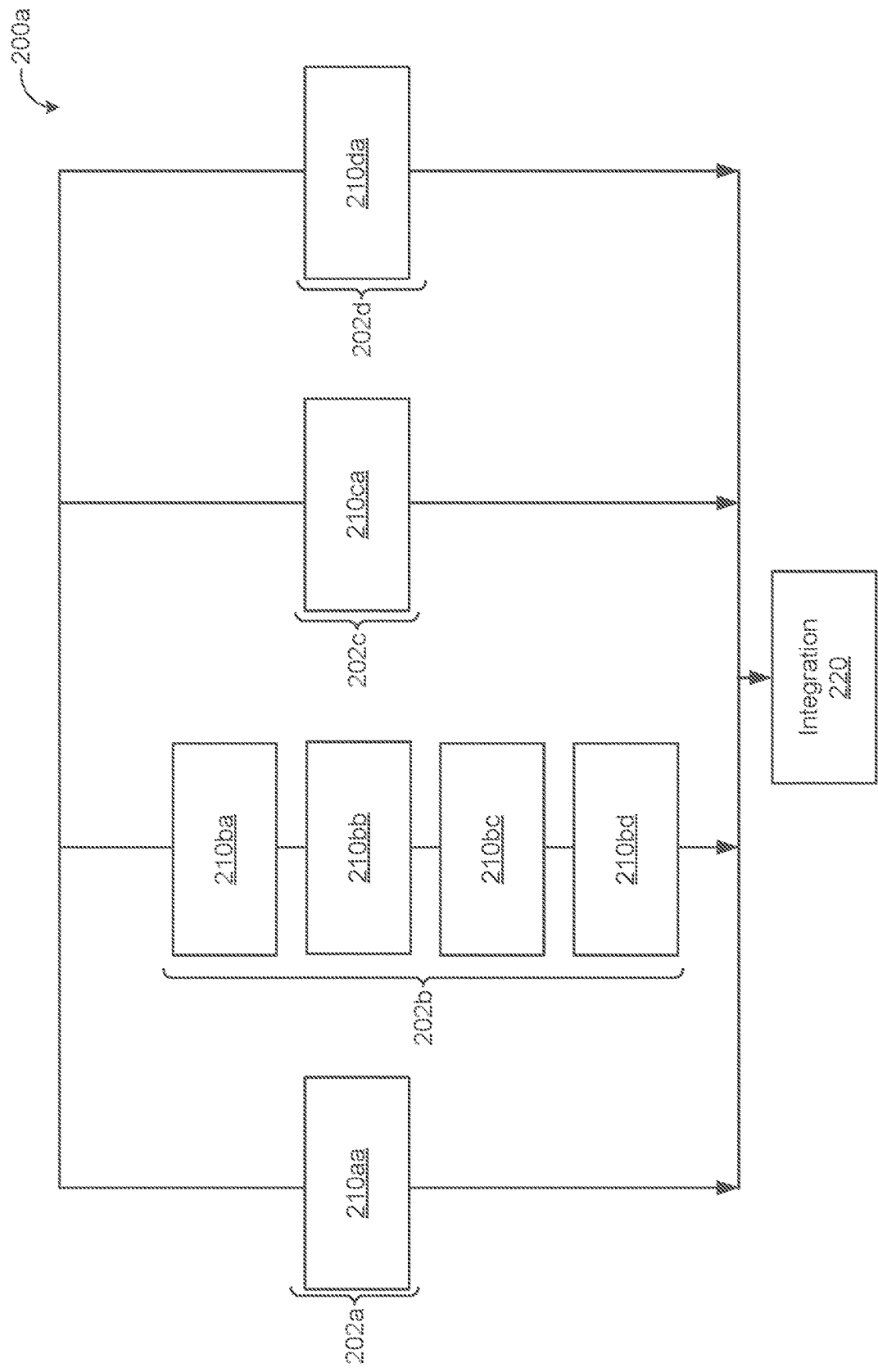
FIGS. 2A and 2B are schematic views of exemplary maps of a plurality of EM loss paths.
Figure 2B:
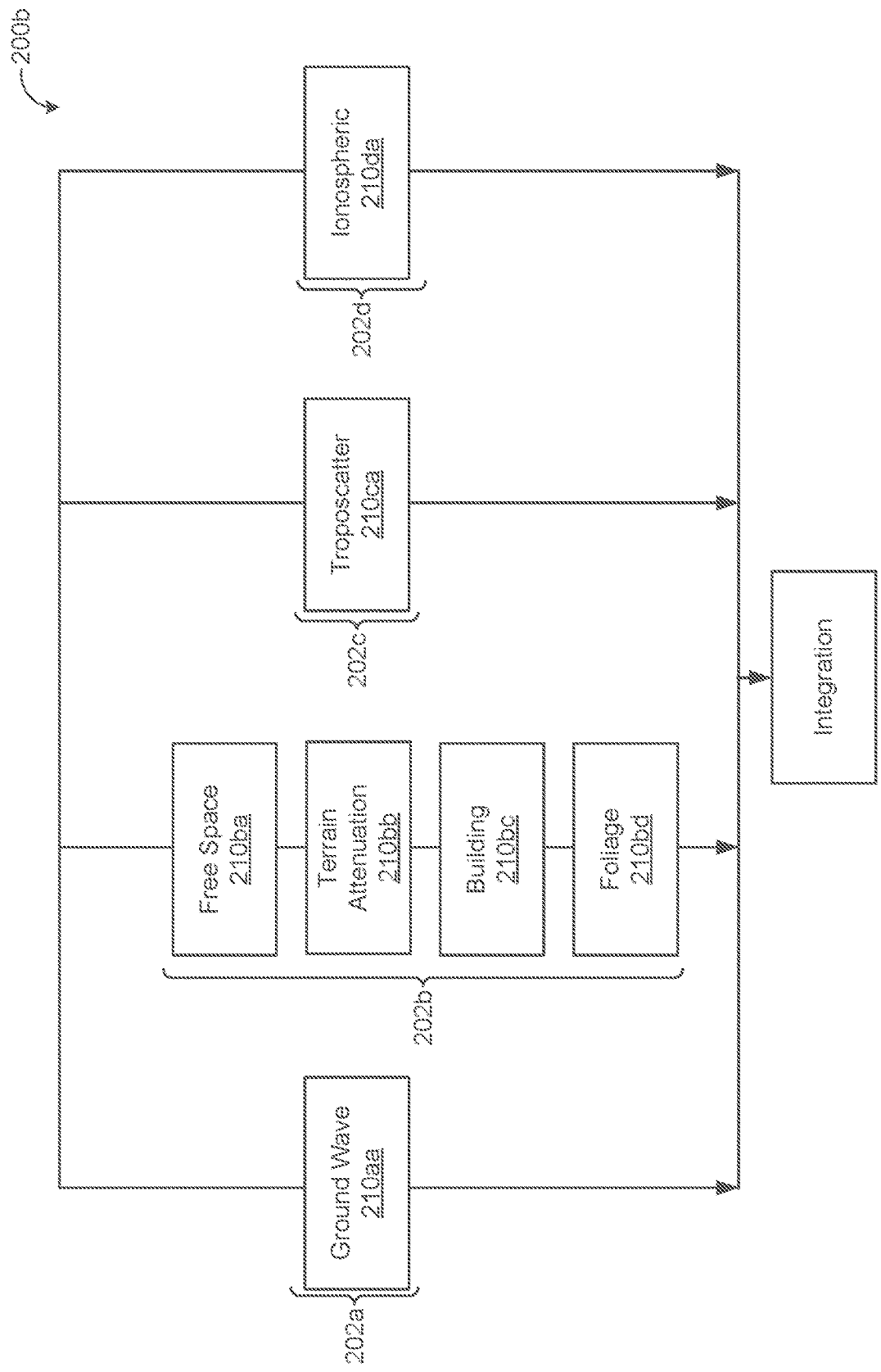

Referring now to FIGS. 2A and 2B, schematic view 200a shows four exemplary EM loss paths 202a-d. Each EM loss path provides a model for a portion of the EM loss between the first geographical point 14a and the second geographical point 14b. In some examples, each EM loss path 202 includes one or more loss components 210, 210aa-210da. Here, the EM loss paths 202a, 202c, 202d include only a single loss component 210aa, 210ca, 210da, while the EM loss path 202b includes four loss components 210ba-210bd. Each loss component 210 represents a composable portion of the total EM loss for the respective EM loss path 202. That is, the total EM loss for a respective EM loss path 202 includes a sum of the loss of each of the loss components 210 (in logarithmic (i.e., dB) representation). For example, the total loss of the EM loss path 202b includes the sum of each of the loss components 210*ba*-210*bd*. An integration block 220 represents the integration of each of the EM loss paths 202*a-d* to determine the total EM loss between the first geographical point 14*a* and the second geographical point 14*b*.

Importantly, the EM loss paths 202 of view 200*a* represent a set of any number of potentially lowest EM loss propagation paths 202*a-n*. In an abstraction, the loss (L) and the loss limit (x) can be modeled as follows:

$$L > x \text{ if } \text{Min}(202a, 202b, \ldots, 202n) < x \quad (1)$$

$$L > x \text{ if } \text{Min}(202a, 202b, \ldots, 202n) > x \quad (2)$$

Equation (1) and Equation (2) imply that the loss through the different paths is significantly unequal. This assumption is generally true in practice. However, even in the worst case where the path loss of two paths is equal results in an error of 3 dB, which is well within the confidence interval for most propagation estimates. Regardless, the significant conclusion of Equations (1) and (2) is that the maximum path loss (i.e., the EM loss path 202 with the greatest EM loss) is not relevant to evaluating either Equation (1) or Equation (2). Instead, the minimum value of each EM loss path 202 is the essential element, regardless of which bounding inequality is evaluated. Thus, in practice, the inequality represented by Equation (1) may be evaluated in many if not most cases without fully computing path loss and by instead eliminating the possibility that the loss could be less than the threshold loss value 12.

Referring now to FIG. 2B, schematic view 200*b* provides a specific example for the four EM loss paths 202*a-d* of FIG. 2A. As used herein, alternative propagation mechanisms for EM propagation from the first geographical point 14*a* to the second geographical point 14*b* are referred to as the EM loss paths 202 which each represent independent physics. As used herein, losses along a given EM loss path 202 are referred to as loss components 210 whose impacts are additive. In the given example, the first so EM loss path 202*a* includes a loss component 210*aa* for ground wave propagation. The second EM loss path 202*b* includes a free space loss component 210*ba*, a terrain attenuation loss component 210*bb*, a building loss component 210*bc*, and a foliage loss component 21*bd*. The third EM loss path 202*c* includes a troposcatter loss component 210*ca* and the fourth EM loss path 202*d* includes an ionospheric loss component 210*da*. While these four EM loss paths 202*a-d* are generally considered to make up the dominant losses in EM path predictions, these four paths are merely examples and are in no way limiting. For example, any number of other EM loss paths 202 may replace or be in addition to these four. For example, anomalous events, such as atmospheric ducting, may include probabilistic overlays on any of the EM loss paths 202. FIG. 2B is merely one example of organization of propagation sub-models, and the EM propagation evaluator 110 is not specific to any particular organization or partitioning of the EM loss paths 202.

Referring back to FIG. 1, the initial evaluator 120, in some examples, obtains, for each of the plurality of EM loss paths 202, a minimum EM loss value 320, 320*a-n* and a maximum EM loss value 330, 330*a-n*. The minimum EM loss value 320 and the maximum EM loss value 330 together represent a plausible range of the potential EM loss for the respective EM loss path 202. As used herein, the plausible range is indeterminate when the plausible range is non-zero (i.e., the minimum EM loss value 320 is less than the maximum EM loss value 330). That is, while the range is known, a specific value within the range is not. For example, the ground wave EM loss path 202*a* of FIG. 2B includes a respective minimum EM loss value 320 and a respective maximum EM loss value 330 and the actual EM loss as a result of ground wave propagation (i.e., EM loss path 202*a*) lies within the range established by the minimum EM loss value 320 and the maximum EM loss value 330. In some implementations, each loss component 210 includes a minimum component loss and a maximum component loss. In these implementations, the minimum EM loss value 320 for the EM loss path 202 is a sum of each of the minimum loss components and similarly the maximum EM loss value 330 for the EM loss path 202 is a sum of each of the maximum loss components. In some examples, the initial evaluator 120 determines, for each of the plurality of EM loss paths 202, whether the maximum EM loss value 330 for the corresponding EM loss path 202 satisfies the threshold loss value 12.

FIGS. 3A-3D show example plots 300*a-d* of EM loss paths 202*a-d* measuring EM loss in dB along an x-axis. The plots 300*a-d* each include four minimum EM loss values 320*a-d* and four maximum EM loss values 330*a-d*, whereby each corresponding EM loss path 202*a-d* includes a corresponding one of the minimum EM loss values 320*a-d* and a corresponding maximum EM loss value 330*a-d*. Each minimum loss value 320*a-d* and maximum loss value 330*a-d* is placed along the x-axis to represent the amount of EM loss measured in dB. Each respective pair of minimum EM loss values 320*a-d* and maximum EM loss values 330*a-d* form a range 312, 312*a-d* of potential loss values for the respective EM loss path 202. The range 312 represents all of the EM loss values possible that are greater than and include the minimum EM loss value 320 and also less than and include the maximum EM loss value 330. That is, the minimum EM loss value 320 and the maximum EM loss value 330 for each EM loss path 202 provides a range 312 of potential EM loss values for an actual EM loss value 340 (FIG. 3D) of the EM loss path 202. While, at this point, the actual EM loss value 340 is indeterminate, it can be assumed that the actual EM loss value 340 is greater than or equal to the minimum EM loss value 320 or less than or equal to the maximum EM loss value 330. The plots 300*a-d* also include an indicator for the threshold loss value 12. In this example, the threshold loss value 12 is 125 dB.

Figure 3A:
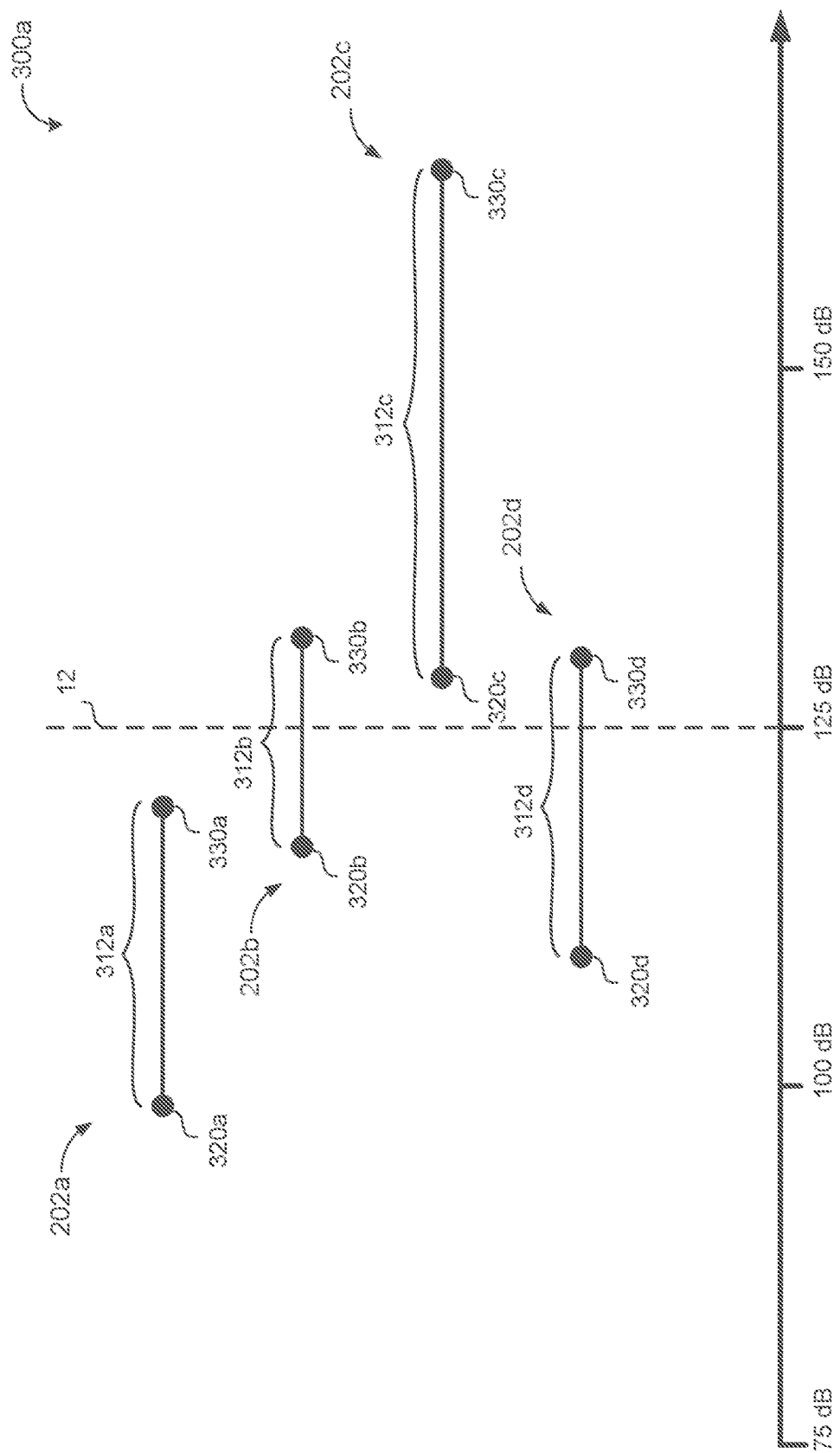
FIGS. 3A-3D are schematic views of exemplary ranges of loss for the plurality of EM loss paths of FIGS. 2A and 2B.

Referring to the plot 300*a* of FIG. 3A, in some implementations, the initial evaluator 120 determines whether the maximum EM loss value 330 for each EM loss path 202 (i.e., the right-most point of each range 312 in FIG. 3A) satisfies the threshold loss value 12. For example, the maximum EM loss value 330 satisfies the threshold loss value 12 when the maximum EM loss value 330 is less than the threshold loss value 12. Here, the maximum EM loss value 330*a* of the EM loss path 202*a* is less than the threshold loss value 12 while the maximum EM loss values 330*b-d* are greater than the threshold loss value 12.

In some implementations, when the maximum EM loss value 330 for the corresponding EM loss path 202 satisfies the threshold loss value 12, the initial evaluator 120 determines that the actual EM loss value 340 for the corresponding EM loss path 202 between the first geographical point 14*a* and the second geographical point 14*b* satisfies the threshold loss value 12. The actual EM loss value 340 refers to the EM loss value that the EM propagation evaluator 110 could determine based on a higher accuracy model or algorithm (i.e., more resource intensive). That is, the range 312 represents a low resolution (and low cost) EM loss result for a particular EM loss path 202 while the actual EM loss value 340 represents a high resolution (and high cost) EM loss result for the same particular EM loss path 202. While the actual EM loss value 340 is more precise than the range 312, the associated resource cost is often unnecessary as the lower resolution range 312 is sufficient for the initial evaluator 120 to determine that the loss for a respective EM loss path 202 is acceptable. It is important to note that low-resolution in this sense does not mean untrusted. To the contrary, the minimum EM loss values 320 and the maximum EM loss values 330 are assured to be accurate. That is, the measurements, models, and/or algorithms that derive the minimum EM loss values 320 and the maximum EM loss values 330 have a fidelity that is trusted and/or accepted for purposes of analyzing the EM environment. Instead, the low resolution analysis trades precision for speed and cost savings versus the more precise high resolution (i.e., refined) analysis. Put another way, the plausible range 312 offered by the low-resolution analysis provides the same confidence as the high-resolution analysis, but merely has a larger range of potential values.

In the scenario where the maximum EM loss value 330 satisfies the threshold loss value 12 when the maximum EM loss value 330 is less than the threshold loss value 12, FIG. 3A offers an example where the maximum EM loss value 330a satisfies the threshold loss value 12 while the maximum EM loss values 330b-d fail to satisfy the threshold loss value. That is, because the entire range 312a is less than the threshold loss value 12, despite the actual EM loss value 340 for the EM loss path 202a being undetermined, the initial evaluator 120 can safely conclude that the EM loss for the EM loss path 202a is acceptable. Based on this result, the EM propagation evaluator 110 may conclude EM propagation analysis for the associated geographical points without the need to do any further and more detailed (and more costly) analysis.

Figure 3B:
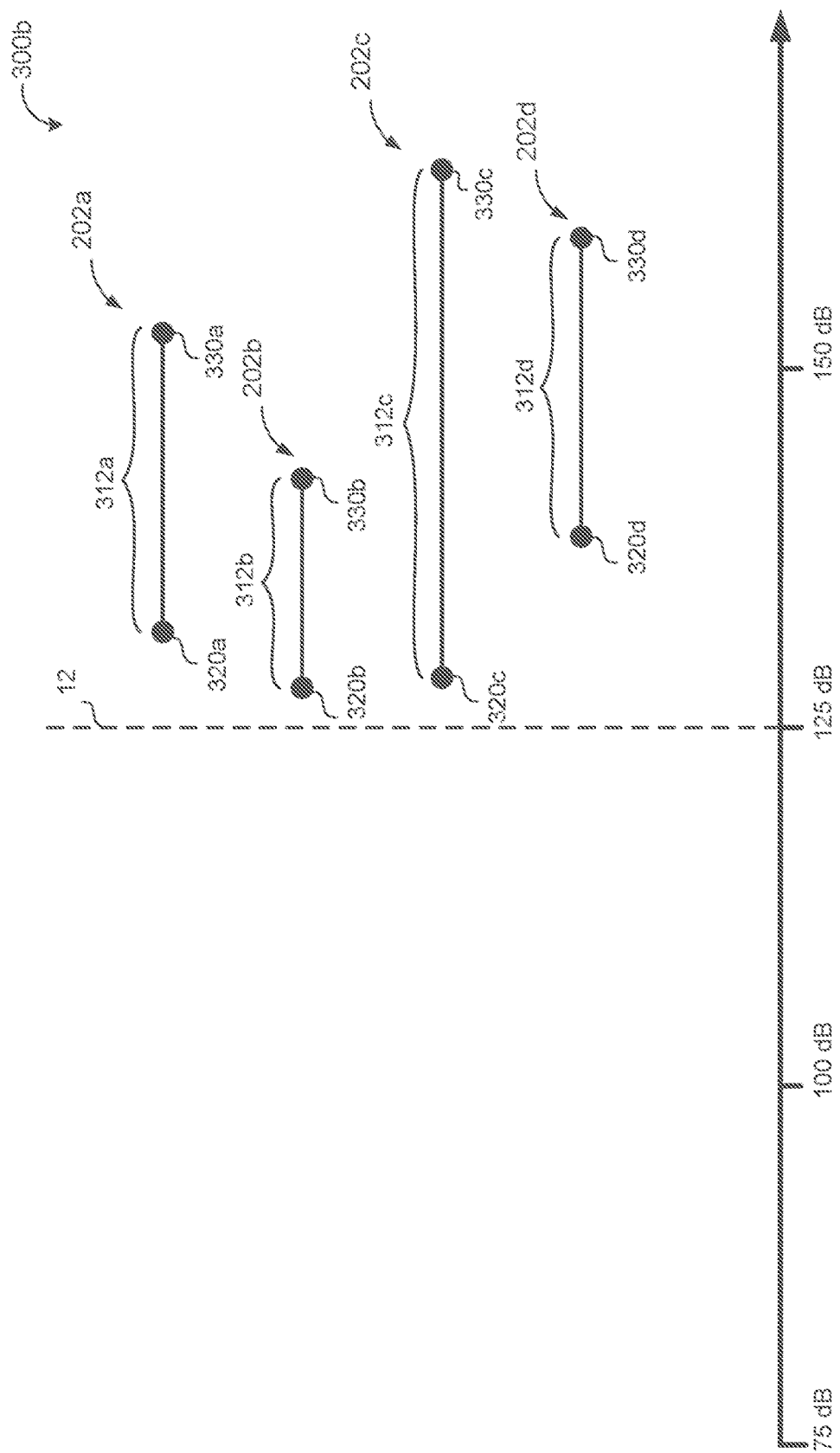

Referring now to the plot 300b of FIG. 3B, in some implementations, the initial evaluator 120 determines whether the minimum EM loss value 320 for each corresponding EM loss path 202 between the first geographical point 14a and the second geographical point 14b fails to satisfy the threshold loss value 12. The minimum EM loss value 320 may fail to satisfy the threshold loss value 12 when the minimum EM loss value 320 is greater than the threshold loss value 12. Optionally, the initial evaluator 120 makes this determination when the maximum EM loss value 330 obtained for each corresponding EM loss path 202 between the first geographical point 14a and the second geographical point 14b fails to satisfy the threshold loss value 12.

When the minimum EM loss value 320 obtained for each corresponding EM loss path 202 fails to satisfy the threshold loss value 12, the initial evaluator 120 may determine that each of the plurality of EM loss paths 202 between the first geographical point 14a and the second geographical point 14b include the actual EM loss value 340 that fails to satisfy the threshold loss value 12. That is, when all of the minimum EM loss values 320 exceed the threshold loss value 12, the initial evaluator 120 may conclude that all of the EM loss paths 202 result in unacceptable attenuation and that further analysis of these EM loss paths 202 is not required.

In the given example of plot 300b, the minimum EM loss values 320a-d all exceed (i.e., are greater than) the threshold loss value 12. That is, all of the minimum loss values 320a-d are greater than 125 dB. In this specific example, the initial evaluator 120 may determine that the actual EM loss value 340 of each of the EM loss paths 202 exceed the threshold loss value 12. As another example, FIG. 3A illustrates only a single minimum EM loss value 320c that exceeds the threshold loss value 12. That is, in the example of FIG. 3A, the initial evaluator 120 may determine that only the EM loss path 202c fails to satisfy the threshold loss value 12.

Referring back to FIG. 1, in some implementations, the EM propagation evaluator 110 includes a refinement investor 130. The refinement investor 130, under certain scenarios, invests additional resources (e.g., computational resources, bandwidth resources, time, etc.) into refining one or more EM loss paths 202 (i.e., one or more loss components 210). For example, when the initial evaluator 120 cannot definitely determine whether all of the EM loss paths 202 satisfy or fail to satisfy the threshold loss value 12 (i.e., based on the low resolution minimum EM loss values 320 and the maximum EM loss values 330), the refinement investor 130 may refine the minimum EM loss values 320 and/or maximum EM loss values 330 for one or more loss components 210 to reduce the range 312 of the EM loss path 202 and thereby increase the resolution of the analysis. The refinement investor 130 may determine an order of refinement based on a refining cost 30 for the refinement of the minimum EM loss value 320 and/or the maximum EM loss value 330 of each loss component 210. That is, the refinement investor 130 may base refinement on the cost for refinement. For example, the refinement investor 130 may select a loss component 210 with a lowest refining cost 30 prior to selecting a loss component 210 with a higher refining cost 30. Put another way, the refining cost 30 allows for an aspect of prioritization for the process of refining one or more EM loss paths 202.

In some examples, each loss component 210 is associated with at least one refining cost 30. Optionally, one or more loss components 210 (e.g., a terrain attenuation loss component 210bb) has multiple refining costs 30 to define the cost of multiple methods of refinement. Optionally, multiple models may provide a single physics, such as attenuative loss due to vegetation and structures. For example, a first model may determine an attenuation due to vegetation while a parallel model determines an attenuation due to buildings, and each model may have a different refining cost 30. Each refining cost 30 characterizes an amount of resources the refinement investor 130 must invest into the corresponding loss component 210 for refinement. The resources may include computational resources, bandwidth resources, temporal resources, etc. For example, a free-space loss that uses a general algorithm has a low refining cost 30, while computing terrain loss may require importing extensive terrain data at a medium refining cost 30. As another example, computing urban attenuation has a very high refining cost 30. A refining cost 30 of zero may indicate that no further refinement is possible.

The refining cost 30 may be a single scalar or a vector of costs for different resources. Each refining cost 30 may be weighted. The refining cost 30 may also include an indication as to an amount of refinement achieved from the corresponding refinement. That is, the refining cost 30 may include an aspect that reflects an amount that the corresponding range 312 will reduce based on the refinement. For example, reducing the range 312 between the minimum EM loss value 320 and the maximum EM loss value 330 to the same value (i.e., the minimum EM loss value 320 and the maximum EM loss value 330 are the same value) is a maximum amount of refinement, while any refinement where the maximum EM loss value 330 is still greater than the minimum EM loss value 320 is a lesser refinement.

The refinement investor 130 receives the refining cost 30 and any additional EM impediment data 20b necessary to perform the refinement. For example, the refinement may require additional geo-spatial data (e.g., terrain data or non-terrain data) to perform the refinement. The refinement investor 130 may receive a refinement indicator 122 from the initial evaluator 120 indicating that further refinement of the EM loss paths 202 is required to properly respond to the EM propagation request 10.

Figure 3C:
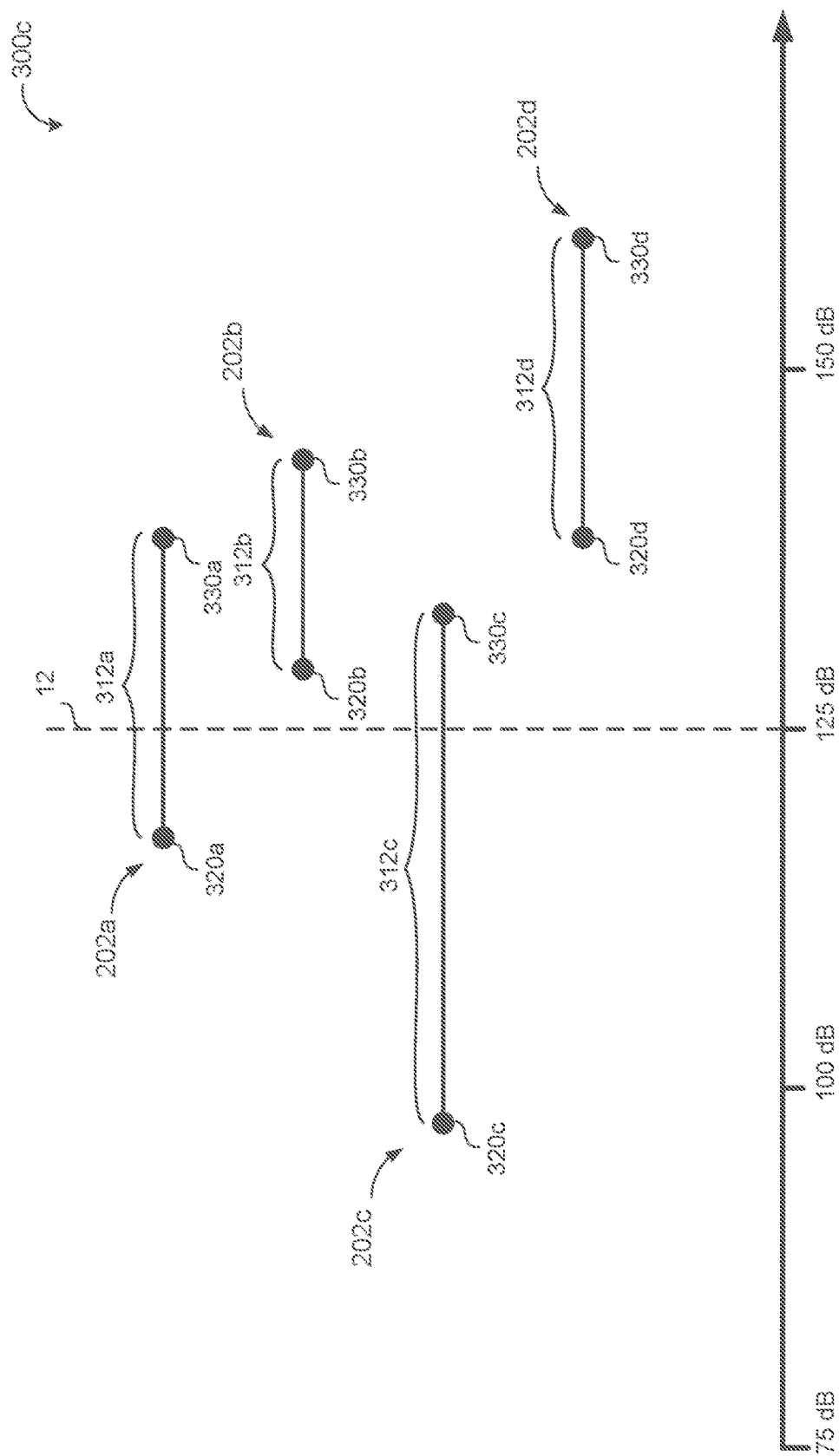

Referring now to the plot 300c of FIG. 3C, in some implementations, when the minimum EM loss value 320 obtained for each of one or more corresponding EM loss paths 202 between the first geographical point 4a and the second geographical point 14b satisfies the threshold loss value 12, and for each EM loss path 202 that includes a minimum EM loss value 320 that satisfies the threshold loss value 12, the refinement investor 130 obtains the refining cost 30 representative of the amount of resources required to refine the minimum EM loss value 320 and/or the maximum EM loss value 330 of the corresponding EM loss path 202. Based on the refining cost 30 for each EM loss path 202 (e.g., each loss component 210 of the EM loss path 202), the refinement investor 130 selects one of the corresponding EM loss paths 202.

In FIG. 3C, the EM loss paths 202b, 202d of plot 300c have a minimum EM loss value 320b, 320d that exceed the threshold loss value 12, and thus are not a candidate for refinement as further refinement does not clarify whether the actual EM loss value 340 is lesser or greater than the threshold loss value 12. Instead, the actual EM loss value 340 must be greater than the threshold loss value 12 and further refinement would be wasted effort. However, both EM loss paths 202a, 202c "straddle" the threshold loss value 12 and thus are candidates for refinement. That is, for both the EM loss path 202a and the EM loss path 202c, the minimum EM loss value 320a, 320c is less than the threshold loss value 12 while the maximum EM loss value 330a, 330c is greater than the threshold loss value 12. Therefore, it is undetermined whether the actual EM loss value 340 is greater than or lesser than the threshold loss value 12 and refinement of the corresponding ranges 312a, 312c may clarify the result.

Figure 3D:
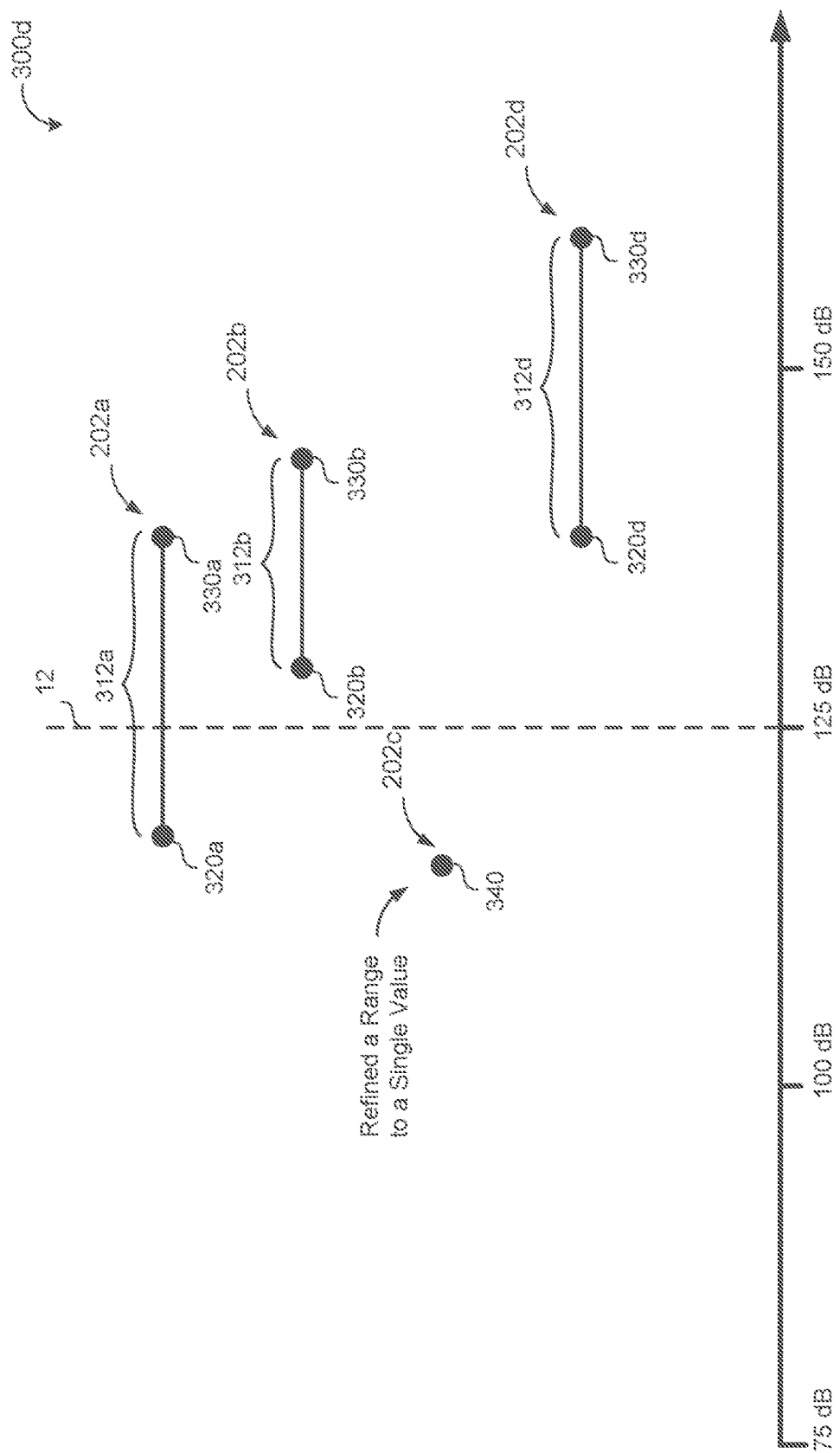

Referring now to the plot 300d of FIG. 3D, continuing the example of FIG. 3C, the refinement investor 130 selects the EM loss path 202c for refinement. For example, the EM loss path 202c is associated with a lower refining cost 30 than the EM loss path 202a and thus it is less expensive for the refinement investor 130 to refine. The refinement investor 130 may refine the corresponding minimum EM loss value 320 and/or maximum EM loss value 330 of the selected EM loss path 202.

In some implementations, the refinement investor 130 may refine very low refining cost 30 EM loss paths 202 and/or loss components 210 directly. For example, the free-space loss is a closed-form equation that requires minimal resources to compute directly. In this case, the initial evaluator 120 or the refinement investor 130 may determine the free-space loss directly and the minimum EM loss value 320 and the maximum EM loss value 330 are set to the same value and are associated with a cost of zero. This indicates that further refinement is not possible.

Here, plot 300d shows the refinement of the EM loss path 202c to the actual EM loss value 340. That is, in this example, the refinement investor 130 executed a complete refinement of the EM loss path 202c such that the minimum EM loss value 320c and the maximum EM loss value 330c are the same value and thus the range 312c becomes the single point of the actual EM path loss value 340. In other examples, the refinement may instead only partially refine the EM path loss 202 and only partially reduce the associated range 312.

In some examples, the refinement investor 130 determines whether the refined maximum EM loss value (here, the actual EM loss value 340) satisfies the threshold loss value 12. When the refined maximum EM loss value satisfies the threshold loss value 12, the refinement investor 130, in some implementations, determines that the actual EM loss value 340 for the selected one of the one or more corresponding EM loss paths 202 between the first geographical point 14a and the second geographical point 14b satisfies the threshold loss value 12. Again referring to the specific example of FIG. 3D, the actual EM loss value 340 of EM loss path 202c is less than the threshold loss value 12, and thus the refinement investor 130 may conclude that the analysis is complete without further refinement necessary. In the scenario where refinement of the EM loss path 202c did not result in the maximum EM loss value 330c satisfying the threshold loss value 12, the refinement investor 130 may select either the same EM loss path 202 or a different EM loss path 202 for additional refinement. The refinement investor 130 may continue to refine the EM loss paths 202 until the refinement investor 130 can definitively respond to the EM propagation request 10.

In this way, the EM propagation evaluator 110 first attempts to determine a response to the EM propagation request 10 using only the initial evaluator 120 and the initial minimum EM loss values 320 and maximum EM loss values 330. If this is unsuccessful, the refinement investor 130 intelligently refines EM loss paths 202 until the refinement investor 130 can definitively answer the EM propagation request 10, thus minimizing the amount of refinement required and thus reducing costs.

Referring again back to FIG. 1, when the EM propagation evaluator 110 can definitively respond to the EM propagation request 10, either the initial evaluator 120 or the refinement investor 130 transmits a request response 150 to the requester (e.g., another component of the processing system 140, a third party device, etc.). When the initial evaluator 120 is able to determine the response to the request 10, the initial evaluator 120 transmits the request response 150. This occurs when, for example, the initial evaluator 120 determines that one or more of the maximum EM loss values 330 for one or more EM loss paths 202 is less than the threshold loss value 12 or each of the minimum EM loss values 320 for each of the EM loss paths 202 is greater than the threshold loss value 12. Alternatively, when the initial evaluator 120 cannot definitively determine the result, the refinement investor 130 transmits the request response 150 after refining one or more EM loss paths 202. In some implementations, the processing system 140 (or any other device in communication with the processing system 140) uses the request response 150 to plan wireless network coverage and/or perform dynamic deconfliction of wireless spectrum usage. The processing system 140 may perform such analysis regularly (e.g., once an hour, once a day, once a week, etc.).

In some examples, each of the minimum EM loss values 320 and maximum EM loss values 330 are associated with an initial cost. The initial cost represents an amount of resources required to obtain the minimum EM loss values 320 and the maximum EM loss values 330 (e.g., from the initial EM impediment data 20a). Optionally, the initial cost associated with the minimum EM loss values 320 and the maximum EM loss values 330 is less than the associated refining costs 30. That is, generally speaking, it requires less resources to obtain the lower resolution results represented by the range 312 between the minimum EM loss value 320 and the maximum EM loss value 330 than the resources required to obtain the higher resolution refined results. This difference in cost (i.e., between the initial cost and the refining cost 30) results in the potential resource savings of the EM propagation evaluator 110.

In some examples, the initial evaluator 120 obtains the minimum EM loss values 320 and/or the maximum EM loss values 330 from data (i.e., the initial EM impediment data 20a) that is associated with a previously determined actual EM loss value 340. For example, when the refinement investor 130 refines an EM loss path 202, the EM propagation evaluator 110 may store the result. After receiving a subsequent request 10, the initial evaluator 120 may interpolate or statistically abstract the stored results to quickly obtain a minimum EM loss value 320 and a maximum EM loss value 330 based on the stored result. Additionally or alternatively, the initial evaluator 120 may obtain the minimum EM loss values 320 and the maximum EM loss values 330 from analysis or interpolation of measured data or simpler models or algorithms (i.e., simpler and therefore less expensive than the models or algorithms employed by the refinement investor 130). In some implementations, the initial evaluator 120 obtains the minimum EM loss values 320 and/or the maximum EM loss values 330 from precomputed data. For example, the initial evaluator 120 obtains, either prior to or in response to the request 10, values previously computed.

Thus, the EM propagation evaluator 110 provides request responses 150 that provide answers to the inequalities represented in Equations (1) and (2) rather than providing a direct estimate of loss. The EM propagation evaluator 110 prioritizes the potential of different refinements to increase precision only as needed. This allows the EM propagation evaluator 110 to strategically approach the EM propagation analysis and to select low resource consumption options to disprove the falsifiable expressions at the lowest possible resource cost and terminating the analysis or consideration as soon as an unambiguous determination is made.

In some implementations, the request response 150, instead of returning an affirmative or negative response to the EM propagation request 10 (i.e., "yes" the EM path loss is greater than the threshold loss value 12 or "no" the EM path loss is not greater than the threshold loss value 12), the request response returns the ranges 312 to provide a confidence interval. In this scenario, a follow-up request make request for refinement of the confidence interval (i.e., by investing additional resources into the analysis).

Figure 4:
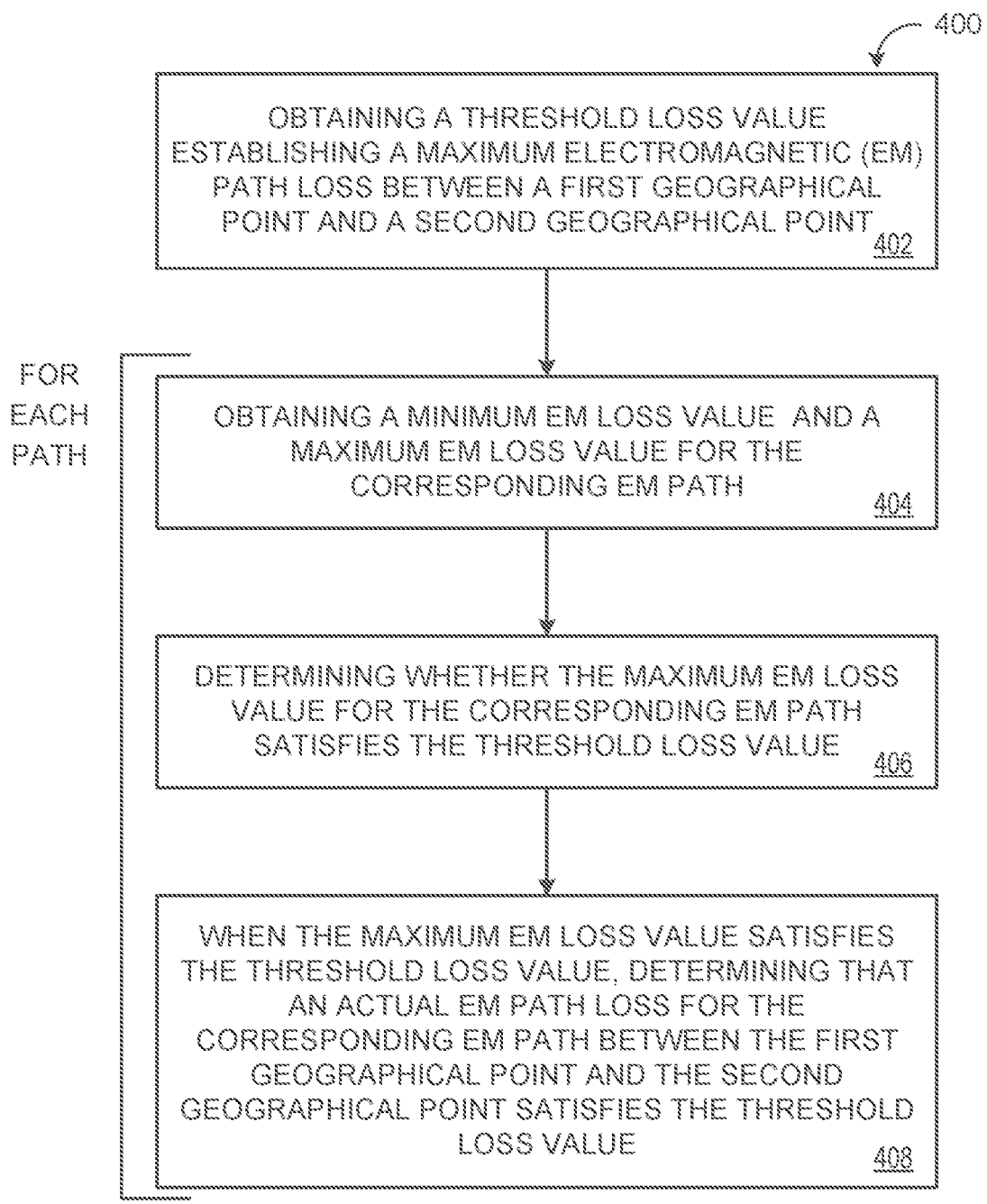
FIG. 4 is a flowchart of an example arrangement of operations for a method of rapidly evaluating inequality expressions for electromagnetic propagation.

FIG. 4 is a flowchart of an exemplary arrangement of operations for a method 400 of rapid evaluation of inequality expressions for electromagnetic propagation. The method 400, at operation 402, includes obtaining a threshold loss value 12 establishing a maximum electromagnetic (EM) path loss between a first geographical point 14a and a second geographical point 14b. For each of a plurality of EM loss paths 202 between the first geographical point 14a and the second geographical point 14b, the method 400 includes, at operation 404, obtaining a minimum EM loss value 320 for the corresponding EM loss path 202 and a maximum EM loss value 330 for the corresponding EM loss path 202. At operation 406, the method 400 includes determining whether the maximum EM loss value 330 for the corresponding EM loss path 202 satisfies the threshold loss value 12. The method 400, at operation 408, includes that, when the maximum EM loss value 330 for the corresponding EM loss path 202 satisfies the threshold loss value 12, determining that an actual EM loss value 340 for the corresponding EM loss path 202 between the first geographical point 14a and the second geographical point 14b satisfies the threshold loss value 12.

Figure 5:
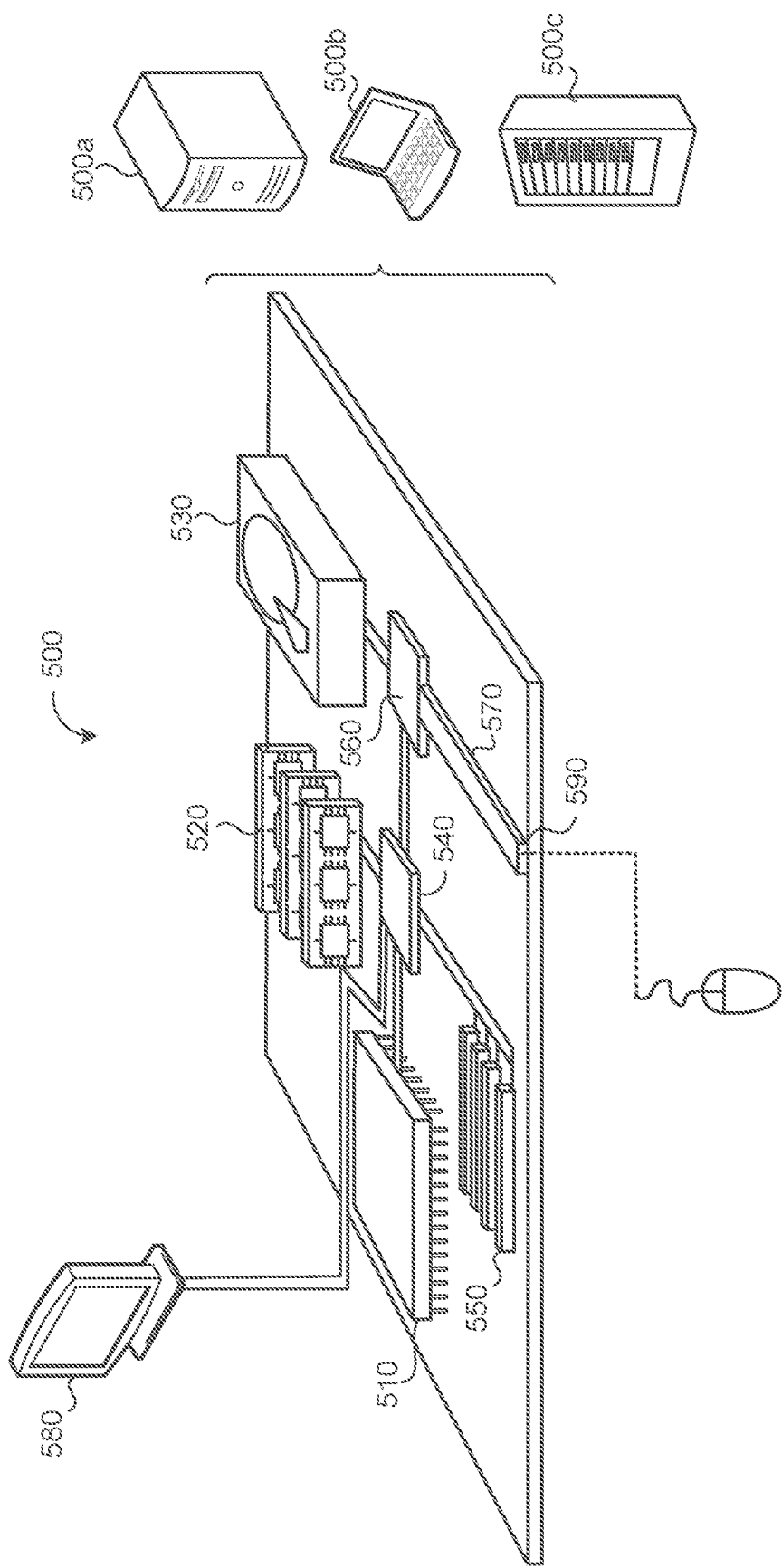
FIG. 5 is a schematic view of an example computing device that may be used to implement the systems and methods described herein.

FIG. 5 is schematic view of an example computing device 500 that may be used to implement the systems and methods described in this document. The computing device 500 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 500 includes a processor 510, memory 520, a storage device 530, a high-speed interface/controller 540 connecting to the memory 520 and high-speed expansion ports 550, and a low speed interface/controller 560 connecting to a low speed bus 570 and a storage device 530. Each of the components 510, 520, 530, 540, 550, and 560, are interconnected using various busses, and may be mounted on a common motherboard or in other manners as appropriate. The processor 510 can process instructions for execution within the computing device 500, including instructions stored in the memory 520 or on the storage device 530 to display graphical information for a graphical user interface (GUI) on an external input/output device, such as display 580 coupled to high speed interface 540. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 520 stores information non-transitorily within the computing device 500. The memory 520 may be a computer-readable medium, a volatile memory unit(s), or non-volatile memory unit(s). The non-transitory memory 520 may be physical devices used to store programs (e.g., sequences of instructions) or data (e g, program state information) on a temporary or permanent basis for use by the computing device 500. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 530 is capable of providing mass storage for the computing device 500. In some implementations, the storage device 530 is a computer-readable medium. In various different implementations, the storage device 530 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 520, the storage device 530, or memory on processor 510.

The high speed controller 540 manages bandwidth-intensive operations for the computing device 500, while the low speed controller 560 manages lower bandwidth-intensive operations. Such allocation of duties is exemplary only. In some implementations, the high-speed controller 540 is coupled to the memory 520, the display 580 (e.g., through a graphics processor or accelerator), and to the high-speed expansion ports 550, which may accept various expansion cards (not shown). In some implementations, the low-speed controller 560 is coupled to the storage device 530 and a low-speed expansion port 590. The low-speed expansion port 590, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 500*a* or multiple times in a group of such servers 500*a*, as a laptop computer 500*b*, or as part of a rack server system 500*c*.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

A software application (i.e., a software resource) may refer to computer software that causes a computing device to perform a task. In some examples, a software application may be referred to as an "application," an "app," or a"program." Example applications include, but are not limited to, system diagnostic applications, system management applications, system maintenance applications, word processing applications, spreadsheet applications, messaging applications, media streaming applications, social networking applications, and gaming applications.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback, and input from the user can be received in any form, including acoustic, speech, or tactile input. In addition, a computer can interact with a user by sending documents to and receiving documents from a device that is used by the user, for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A computer-implemented method when executed by data processing hardware causes the data processing hardware to perform operations comprising:
   obtaining a threshold loss value establishing a maximum electromagnetic (EM) path loss between a first geographical point and a second geographical point;
   for each of a plurality of EM paths between the first geographical point and the second geographical point:
   obtaining a minimum EM loss value for the corresponding EM path and a maximum EM loss value for the corresponding EM path;
   determining whether the maximum EM loss value for the corresponding EM path satisfies the threshold loss value; and
   when the maximum EM loss value for the corresponding EM path satisfies the threshold loss value, determining that an actual EM path loss value for the corresponding EM path between the first geographical point and the second geographical point satisfies the threshold loss value,
wherein:
   each of the plurality of EM paths comprises one or more loss components; and
   for each of the plurality of EM paths:
      the minimum EM loss value comprises a sum of a minimum of each of the one or more loss components of the corresponding EM path; and
      the maximum EM loss value comprises a sum of a maximum of each of the one or more loss components of the corresponding EM path.

2. The method of claim 1, wherein the maximum EM loss value for the corresponding EM path:
   satisfies the threshold loss value when the maximum EM loss value is less than the threshold loss value; and
   fails to satisfy the threshold loss value when the maximum EM loss value is greater than or equal than the threshold loss value.

3. The method of claim 1, wherein the operations further comprise, when the maximum EM loss value obtained for each corresponding EM path of the plurality of EM paths between the first geographical point and the second geographical point fails to satisfy the threshold loss value:
   determining whether the minimum EM loss value obtained for each corresponding EM path of the plurality of EM paths between the first geographical point and the second geographical point fails to satisfy the threshold loss value; and
   when the minimum EM loss value obtained for each corresponding EM path fails to satisfy the threshold loss value, determining that each of the plurality of EM paths between the first geographical point and the second geographical point comprise a corresponding actual EM path loss value that fails to satisfy the threshold loss value.

4. The method of claim 3, wherein the operations further comprise, when the minimum EM loss value obtained for each of one or more corresponding EM paths of the plurality of EM paths between the first geographical point and the second geographical point satisfies the threshold loss value:
   for each of the one or more corresponding EM paths comprising the minimum EM loss value that satisfied the threshold loss value, obtaining a refining cost associated with the corresponding EM loss path, the refining cost representative of an amount of resources required to refine the minimum EM loss value and the maximum EM loss value of the corresponding EM path;
   selecting one of the one or more corresponding EM paths based on the obtained refining costs;
   refining the minimum EM loss value obtained for the selected one of the one or more corresponding EM paths and the maximum EM loss value obtained for the selected one of the one or more corresponding EM paths;
   determining whether the refined maximum EM loss value satisfies the threshold loss value; and
   when the refined maximum EM loss value satisfies the threshold loss value, determining that the actual EM path loss for the selected one of the one or more corresponding EM paths between the first geographical point and the second geographical point satisfies the threshold loss value.

5. The method of claim 4, wherein the operations further comprise,
when the refined minimum EM loss value fails to satisfy the threshold loss value, selecting a different one of the one or more corresponding EM paths based on the obtained refining costs.

6. The method of claim 4, wherein selecting one of the one or more corresponding EM paths comprises selecting the one of the one or more corresponding EM paths associated with the lowest refining cost.

7. The method of claim 4, wherein, for each of the plurality of EM paths, the corresponding minimum EM loss value and the corresponding maximum EM loss value are associated with an initial cost representative of an amount of resources required to obtain the minimum EM loss value and the maximum EM loss value.

8. The method of claim 7, wherein, for each of the plurality of EM paths, the initial cost is less than the refining cost.

9. The method of claim 1, wherein, for one or more of the plurality of EM paths, the minimum EM loss value for the corresponding EM path and the maximum EM loss value for the corresponding EM path comprise data associated with a previously determined actual EM path loss value.

10. The method of claim 1, wherein obtaining the threshold loss value comprises receiving a request comprising the threshold loss value, the request requesting determination of whether an actual EM path loss between the first geographical point and the second geographical point exceeds the threshold loss value.

11. The method of claim 1, wherein obtaining the threshold loss value comprises receiving a request comprising the threshold loss value, the request requesting determination of whether an actual EM path loss between the first geographical point and the second geographical point is less than the threshold loss value.

12. The method of claim 1, wherein the operations further comprise, responsive to determining whether the actual EM path loss value for the corresponding EM path between the first geographical point and the second geographical point satisfies the threshold loss value, planning wireless network coverage.

13. The method of claim 1, wherein the operations further comprise, responsive to determining whether the actual EM path loss value for the corresponding EM path between the first geographical point and the second geographical point satisfies the threshold loss value, performing dynamic deconfliction of wireless spectrum usage.

14. A system comprising:
data processing hardware; and
memory hardware in communication with the data processing hardware, the memory hardware storing instructions that when executed on the data processing hardware cause the data processing hardware to perform operations comprising:
   obtaining a threshold loss value establishing a maximum electromagnetic (EM) path loss between a first geographical point and a second geographical point;
   for each of a plurality of EM paths between the first geographical point and the second geographical point:
      obtaining a minimum EM loss value for the corresponding EM path and a maximum EM loss value for the corresponding EM path;
      determining whether the maximum EM loss value for the corresponding EM path satisfies the threshold loss value; and
      when the maximum EM loss value for the corresponding EM path satisfies the threshold loss value, determining that an actual EM path loss value for the corresponding EM path between the first geographical point and the second geographical point satisfies the threshold loss value, wherein:
each of the plurality of EM paths comprises one or more loss components; and
for each of the plurality of EM paths:
the minimum EM loss value comprises a sum of a minimum of each of the one or more loss components of the corresponding EM path; and
the maximum EM loss value comprises a sum of a maximum of each of the one or more loss components of the corresponding EM path.

15. The system of claim 14, wherein the maximum EM loss value for the corresponding EM path:
satisfies the threshold loss value when the maximum EM loss value is less than the threshold loss value; and
fails to satisfy the threshold loss value when the maximum EM loss value is greater than or equal than the threshold loss value.

16. The system of claim 14, wherein the operations further comprise, when the maximum EM loss value obtained for each corresponding EM path of the plurality of EM paths between the first geographical point and the second geographical point fails to satisfy the threshold loss value:
determining whether the minimum EM loss value obtained for each corresponding EM path of the plurality of EM paths between the first geographical point and the second geographical point fails to satisfy the threshold loss value; and
when the minimum EM loss value obtained for each corresponding EM path fails to satisfy the threshold loss value, determining that each of the plurality of EM paths between the first geographical point and the second geographical point comprise a corresponding actual EM path loss value that fails to satisfy the threshold loss value.

17. The system of claim 16, wherein the operations further comprise, when the minimum EM loss value obtained for each of one or more corresponding EM paths of the plurality of EM paths between the first geographical point and the second geographical point satisfies the threshold loss value:
for each of the one or more corresponding EM paths comprising the minimum EM loss value that satisfied the threshold loss value, obtaining a refining cost associated with the corresponding EM loss path, the refining cost representative of an amount of resources required to refine the minimum EM loss value and the maximum EM loss value of the corresponding EM path;
selecting one of the one or more corresponding EM paths based on the obtained refining costs;
refining the minimum EM loss value obtained for the selected one of the one or more corresponding EM paths and the maximum EM loss value obtained for the selected one of the one or more corresponding EM paths;
determining whether the refined maximum EM loss value satisfies the threshold loss value; and
when the refined maximum EM loss value satisfies the threshold loss value, determining that the actual EM path loss for the selected one of the one or more corresponding EM paths between the first geographical point and the second geographical point satisfies the threshold loss value.

18. The system of claim 17, wherein the operations further comprise,
when the refined minimum EM loss value fails to satisfy the threshold loss value, selecting a different one of the one or more corresponding EM paths based on the obtained refining costs.

19. The system of claim 17, wherein selecting one of the one or more corresponding EM paths comprises selecting the one of the one or more corresponding EM paths associated with the lowest refining cost.

20. The system of claim 17, wherein, for each of the plurality of EM paths, the corresponding minimum EM loss value and the corresponding maximum EM loss value are associated with an initial cost representative of an amount of resources required to obtain the minimum EM loss value and the maximum EM loss value.

21. The system of claim 20, wherein, for each of the plurality of EM paths, the initial cost is less than the refining cost.

22. The system of claim 14, wherein, for one or more of the plurality of EM paths, the minimum EM loss value for the corresponding EM path and the maximum EM loss value for the corresponding EM path comprise data associated with a previously determined actual EM path loss value.

23. The system of claim 14, wherein obtaining the threshold loss value comprises receiving a request comprising the threshold loss value, the request requesting determination of whether an actual EM path loss between the first geographical point and the second geographical point exceeds the threshold loss value.

24. The system of claim 14, wherein obtaining the threshold loss value comprises receiving a request comprising the threshold loss value, the request requesting determination of whether an actual EM path loss between the first geographical point and the second geographical point is less than the threshold loss value.

25. The system of claim 14, further comprising, responsive to determining whether the actual EM path loss value for the corresponding EM path between the first geographical point and the second geographical point satisfies the threshold loss value, planning wireless network coverage.

26. The system of claim 14, further comprising, responsive to determining whether the actual EM path loss value for the corresponding EM path between the first geographical point and the second geographical point satisfies the threshold loss value, performing dynamic deconfliction of wireless spectrum usage.

* * * * *